United States Patent
O'Riordan et al.

(10) Patent No.: US 7,367,006 B1
(45) Date of Patent: Apr. 29, 2008

(54) HIERARCHICAL, RULES-BASED, GENERAL PROPERTY VISUALIZATION AND EDITING METHOD AND SYSTEM

(75) Inventors: Donald J. O'Riordan, Santa Clara, CA (US); Friedrich Sendig, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 200 days.

(21) Appl. No.: 11/034,426

(22) Filed: Jan. 11, 2005

(51) Int. Cl.
*G06F 17/50* (2006.01)

(52) U.S. Cl. .......................... 716/11; 716/5

(58) Field of Classification Search .............. 716/1, 716/5, 8–11
See application file for complete search history.

(56) References Cited

U.S. PATENT DOCUMENTS

| | | | | |
|---|---|---|---|---|
| 5,548,524 | A * | 8/1996 | Hernandez et al. | 716/12 |
| 5,808,896 | A * | 9/1998 | Weber | 716/11 |
| 5,912,820 | A * | 6/1999 | Kerzman et al. | 716/6 |
| 6,505,202 | B1 * | 1/2003 | Mosquera et al. | 707/10 |
| 6,886,140 | B2 * | 4/2005 | Regnier | 716/1 |
| 6,973,389 | B1 * | 12/2005 | Mountassir | 702/22 |
| 2004/0163068 | A1 * | 8/2004 | Fukita et al. | 716/11 |

OTHER PUBLICATIONS

Cadence Design Systems, Inc. "Cadence® Hierarchy Editor User Guide" Product Version 5.1.41, Dec. 2005, © 1990-2004, Cover page, Copyright page, Table of Contents, pp. 1-158, Cadence Design Systems, Inc., San Jose, CA.

Cadence Design Systems, Inc. "Virtuoso® Spectre® Circuit Simulator User Guide" Product Version 5.1.41, Jul. 2004, © 1990-2003, Cover page, Copyright page, Table of Contents, pp. 1-332, Cadence Design Systems, Inc., San Jose, CA.

Cadence Design Systems, Inc. "Amsultra: Virtuoso AMS Simulator with Virtuoso Ultrasim Fastspice Solver" Cover page, Table of Contents, pp. 1-8, copyright page, © 2004, Cadence Design Systems, Inc., San Jose, CA.

Cadence Design Systems, Inc. "Fastspice Simulation in the Analog Design Environment" Cover page, Table of Contents, pp. 1-10, copyright page, © 2004, Cadence Design Systems, Inc., San Jose, CA.

Cadence Design Systems, Inc. "Simulating Complex RF/Mixed-Signal Designs Using Virtuoso Ultrasim Full-Chip Simulator" Cover page, Table of Contents, pp. 1-9, copyright page, © 2005, Cadence Design Systems, Inc., San Jose, CA.

(Continued)

*Primary Examiner*—Vuthe Siek
(74) *Attorney, Agent, or Firm*—Bingham McCutchen LLP

(57) ABSTRACT

A hierarchical, rule-based, general property visualization and editing system, method, and computer program for circuit designs is provided. A general rules dictionary is created or obtained that determines how the rules will be applied to the circuit design hierarchy. A hierarchical graphical user interface serves both as an entry means for the properties of the design components, and as a visualization means to view the resolved effective value of the property for each component or sub-hierarchy. The visualization means also provides a mechanism to view the rule resolution process so a user can view and understand the effects of all the rules that have an effect on the property and can modify the rules settings to obtain the desired effective property value. A property configuration file is output from the visualization tool and input into the simulator armed with the same general rules dictionary.

43 Claims, 6 Drawing Sheets

OTHER PUBLICATIONS

Cadence Design Systems, Inc. "TFT Design Verification with Virtuoso Ultrasim Full-Chip Simulator" Cover page, Table of Contents, pp. 1-5, copyright page, © 2004, Cadence Design Systems, Inc., San Jose, CA.

Chen, T.-H. et al. "HiSIM: Hierarchical Interconnect-Centric Circuit Simulator" IEEE/ACM International Conference on Computer-Aided Design (ICCAD '04), San Jose, CA, Nov. 7-11, 2004, pp. 489-496.

Dimopoulos, N.J. et al. "DAME: An Expert Microprocessor-Based-Systems-Designer. An Overview and Status Report" IEEE Pacific Rim Conference on Communications, Computers and Signal Processing, Victoria, B.C., Canada, May 9-10, 1991, pp. 388-391.

Elmqvist, H. et al. "Simulator for Dynamical Systems Using Graphics and Equations for Modeling" IEEE Control systems Magazine, Jan. 1989, pp. 53-58.

Memon, A.M. et al. "Hierarchical GUI Test Case Generation Using Automated Planning" IEEE Transactions on Software Engineering, Feb. 2001, vol. 27, No. 2, pp. 144-155.

Saab, D.G. et al. "CHAMP: Concurrent Hierarchical and Multilevel Program for Simulation of VLSI Circuits" IEEE International Conference on Computer-Aided Design (ICCAD '88), Digest of Technical Papers, Santa Clara, CA, Nov. 7-10, 1988, pp. 246-249.

Zein, D.A. et al. "HLSIM—A New Hierarchical Logic Simulator and Netlist Converter" 29th ACM/IEEE Design Automation Conference (DAC '92), Anaheim, CA, Jun. 8-12, 1992, pp. 432-437.

* cited by examiner

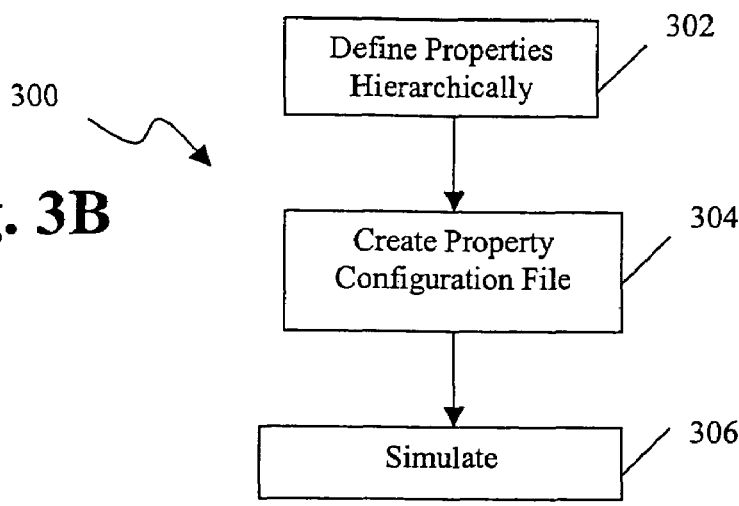
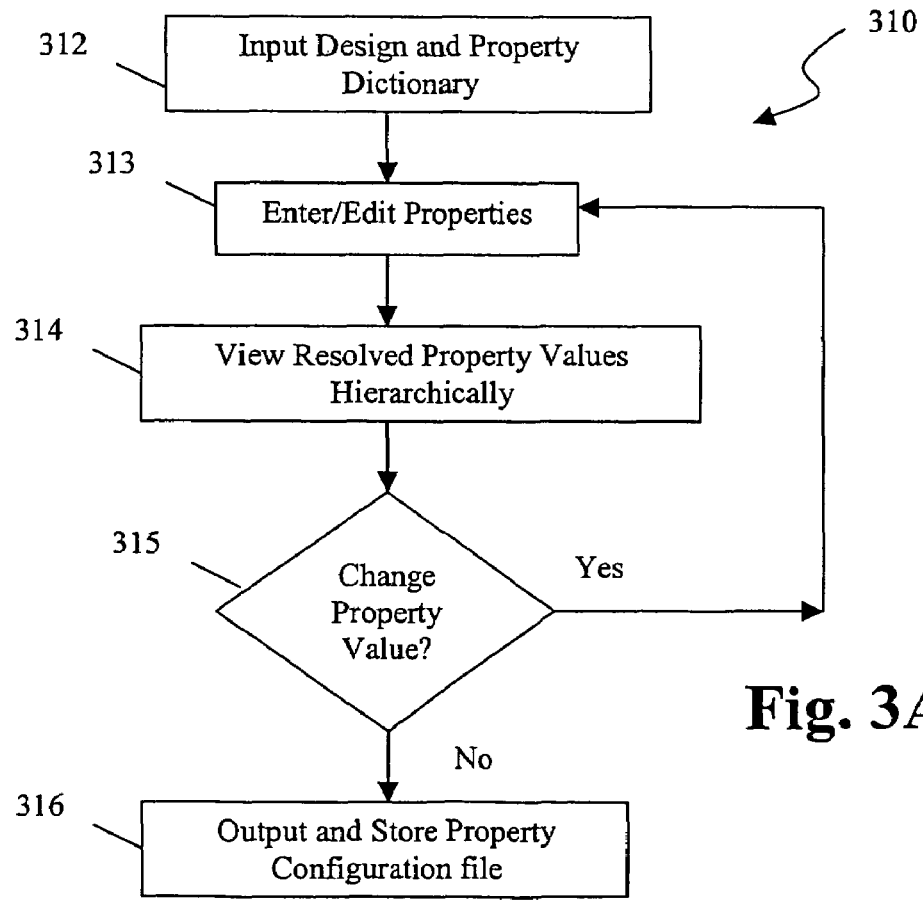

HIERARCHICAL, RULES-BASED, GENERAL PROPERTY VISUALIZATION AND EDITING METHOD AND SYSTEM

BACKGROUND AND SUMMARY

The present embodiments relate to the field of Electronic Design Automation, and more precisely the field of hierarchical system design and analysis, including, but not limited to, circuit simulation.

Electronic systems designs, and in particular semiconductor-based designs can be extremely large and complex systems. Such complexity is enabled by advanced semiconductor processing techniques, which allow systems of enormous intricacy to be physically realized on tiny pieces of semi-conductor, and/or printed circuit boards. As a result of this ever-increasing complexity, and severe market pressures, designers of such systems are forced to use electronic design automation (EDA) techniques such as hierarchical design approaches, design/block re-use, and rules-based systems in order to be able to cope with the vast scale of the solutions they are trying to implement.

Major factors in the hierarchical circuit design complexity are the vast number of blocks of components, the diversity and number of properties that each component may have, and the rules that govern how the property assignments will interact in the hierarchy.

The present embodiments provide a hierarchical, rule-based, general property visualization and editing method, system, and computer program product for circuit design. One embodiment includes configuring a set of supported properties based on an analysis tool, setting values for a first set of selected properties, calculating values for a second set of selected properties, and viewing the set and calculated values.

One method of analyzing a hierarchical circuit design, includes configuring a set of supported properties based on an analysis tool, setting values for the properties using an interface tool, outputting a configuration file from the interface tool, and analyzing the circuit design based on the configuration file.

BRIEF DESCRIPTION OF THE DRAWINGS

FIG. 3A is a representation of property configuration process 310.

FIG. 3B is a representation of the overview circuit design, property configuration, and simulation process 300.

DETAILED DESCRIPTION OF INVENTION

Figure 1A:
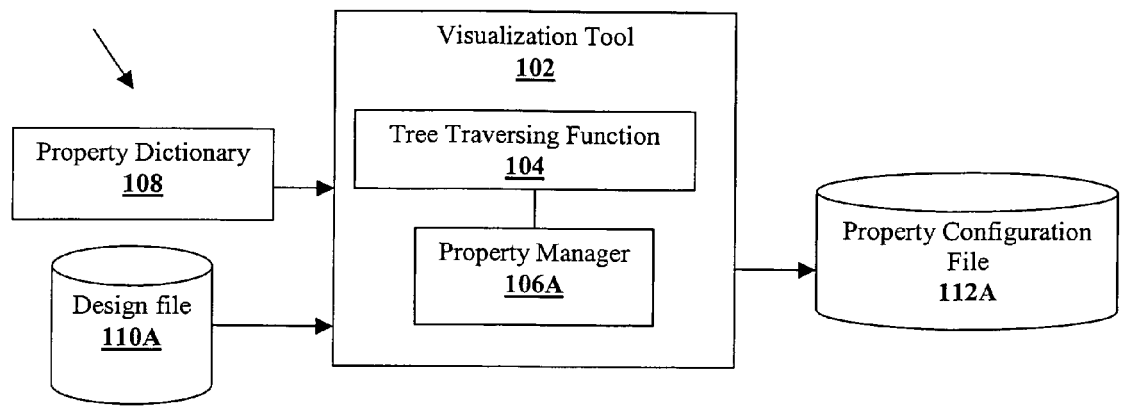
FIG. 1A is a representation of the components to provide hierarchical, rules-based, general property visualization and editing.

The present embodiments are directed to the field of Electronic Design Automation, and more precisely to the field of hierarchical design and analysis, including but not limited to circuit simulation. A hierarchical, rule-based, general property visualization and editing method, system, and computer program product for circuit design is described.

Hierarchical Design

Hierarchical design techniques allow a design to be sub-composed into a number of sub-blocks, and each sub-block further sub-composed into its sub-blocks, etc. in a somewhat recursive manner. The blocks are then combined in a hierarchical manner. At any level of the hierarchy, the designer has to deal with only a small number of blocks (i.e. the blocks corresponding to that particular level of hierarchy), rather than the entire design. The total number of blocks in a hierarchical tree can be extremely vast, but the hierarchical approach makes the overall complexity much easier to manage.

For the purposes of the remaining discussion, the term "cell" will be often used in lieu of the term "block." The term block or cell can refer to a lowest level component, or leaf-level component, of the design hierarchy (i.e. a component that does not include further sub-components), or can refer to a component at intermediate levels of the hierarchy (i.e. a component that does include further blocks or cells of its own).

IP Sharing

Another way to address the design complexity problem (especially with regard to ever shrinking time-to-market windows) is that of design block re-use, or Intellectual Property (IP) sharing. Simply stated, this approach involves the re-use of previously designed blocks as components in new systems, where those blocks were originally designed and used in previous systems. Such blocks (cells) are now often designed especially with this re-use concept in mind.

Systems integrators are free to combine blocks from their previous designs, or blocks designed by some third party (IP provider). In order for this approach to successfully work in the general case, blocks which are re-used in multiple designs or systems need to be delivered by the block author along with specific instructions regarding their use and capabilities. These instructions may be delivered in the form of rules, or in other forms.

Rules

Rule based systems allow a relatively small and humanly manageable number of rules to be specified, and that small number of rules can then be applied to an extremely large system. Consider the following simplified example rule:

Every transistor in this design shall be manufactured such that it can operate from a 1.5 volt power supply.

Automatic application of this rule to a design containing a vast number of transistors (n) is equivalent to the designer providing the following (n) statements:

The first transistor in this design shall be manufactured such that it can operate from a 1.5 volt power supply.

The second transistor in this design shall be manufactured such that it can operate from a 1.5 volt power supply.

. . .

The n'th transistor in this design shall be manufactured such that it can operate from a 1.5 volt power supply.

The automatic application of the simple rule (containing the keyword "every") poses a tremendously lesser burden on the user/designer than forcing him to manually specify the more specific statement on a per-transistor basis, as shown in the second example.

Another rule may be specified at the block level, for example:

All the transistors in this particular block have been designed to operate at voltages of no greater than 2.5 volts. It shall be an error to attempt to operate this block at higher voltages.

An alternative example might be:

In order to successfully simulate this block in a circuit simulation program, the simulator itself must be instructed to solve the individual equations corresponding to this block with a particular degree of precision, and particular simulation options set, else the overall simulation will fail to converge.

It should be noted that these particular examples are deliberately simplistic and easy to understand, however, in reality the nature and number of the rules governing such systems can be quite complex.

Entry and Analysis

Different applications can use different entry methods to specify the parameters. Some applications use different entry methods within the application. Parameters can be specified in text files, specified in different graphical user interface dialogs, and placed as attributes/properties within a circuit schematic. Even within a single application, the mechanics of a given entry method can differ among parameters (i.e., differing text files for different properties).

When blocks are assembled into an overall hierarchical system, the many interactions between the various blocks need to be investigated and verified, using various analysis techniques (e.g., computer simulation). Since the blocks may come from disparate sources, the rules and properties (for example, those governing simulation accuracy) accompanying them also may come from disparate sources. In addition, some rules and properties apply on a global basis only, and others may apply on a global or more localized basis. Specifying and applying such a disparate set of rules or properties in a consistent manner across the entire design hierarchy, while at the same time not interfering with any of those rules for any particular block, can be a particularly daunting task.

Problems of contention (where multiple rules appear to conflict) are resolved internally in the application by the use of precedence and hierarchy rules. Further, it is often the case that different precedence and hierarchical inheritance rules are used for resolution of different parameters and properties, even within the same application. It is also quite often the case that different resolution rules are used within different analysis tools (even those from the same vendor) which are used by the same designer. These differences and inconsistencies often lead to designer confusion.

The inheritance and precedence rules by which an application resolves such conflicts is typically only available in the reference documentation accompanying the application software. Similarly, application outputs such as textual "dumps" (e.g., simulator log files) only show the user the final result of the property value.

Visualization Tool and Property Manager

Some embodiments, include a graphical hierarchical editing and viewing interface, referred to as Visualization Tool 102 shown in FIG. 1A. Once the circuit design file 110A (created with a commercial designing tool such as Cadence Virtuoso "Composer" Schematic Editor) is input, Visualization Tool 102 uses the Tree Traversing Function 104 to walk through the design and to graphically present the design in a hierarchical display.

Figure 2A:
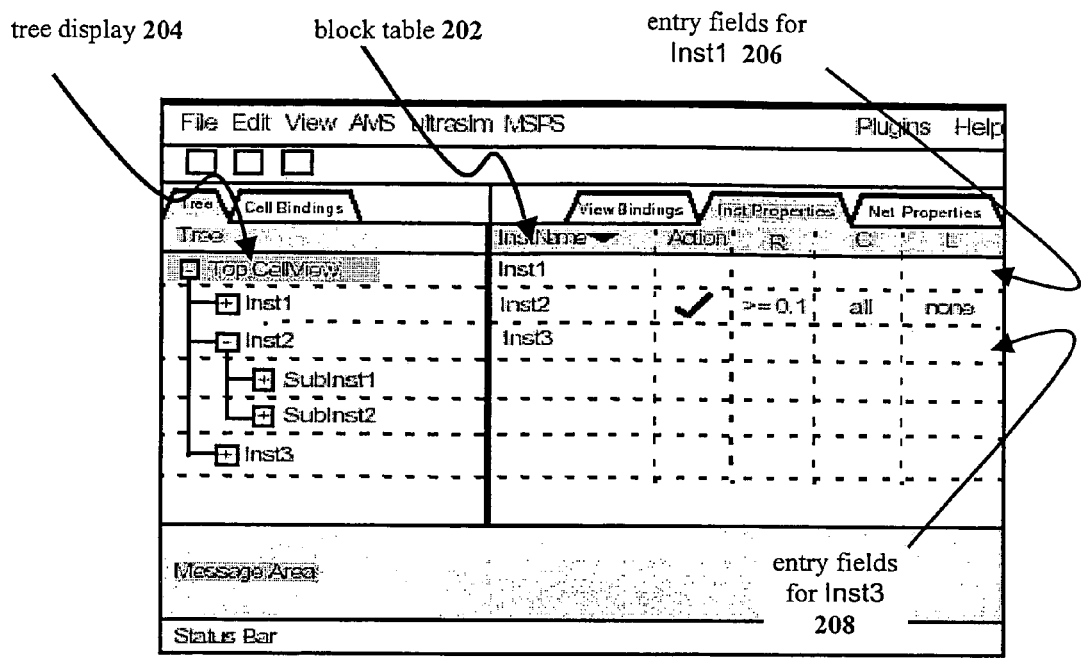
FIG. 2A is a representation of an example Visualization Tool display.

In some embodiments Visualization Tool 102 presents the circuit design in three forms: block table, component table, and tree display. In block table display, Visualization Tool 102 displays a table of all the blocks in a design. An example embodiment of a block table display is element 202 in FIG. 2A. In the component table, Visualization Tool 102 displays a table with a row for each component in a selected block. An example embodiment of a component display is element 225 of FIG. 2B. In the tree display, Visualization Tool 102 displays a node for each component in the entire design. An example embodiment of a tree display is element 204 in FIG. 2A. In another embodiment, any node in the tree display can be collapsed or expanded.

Figure 2B:
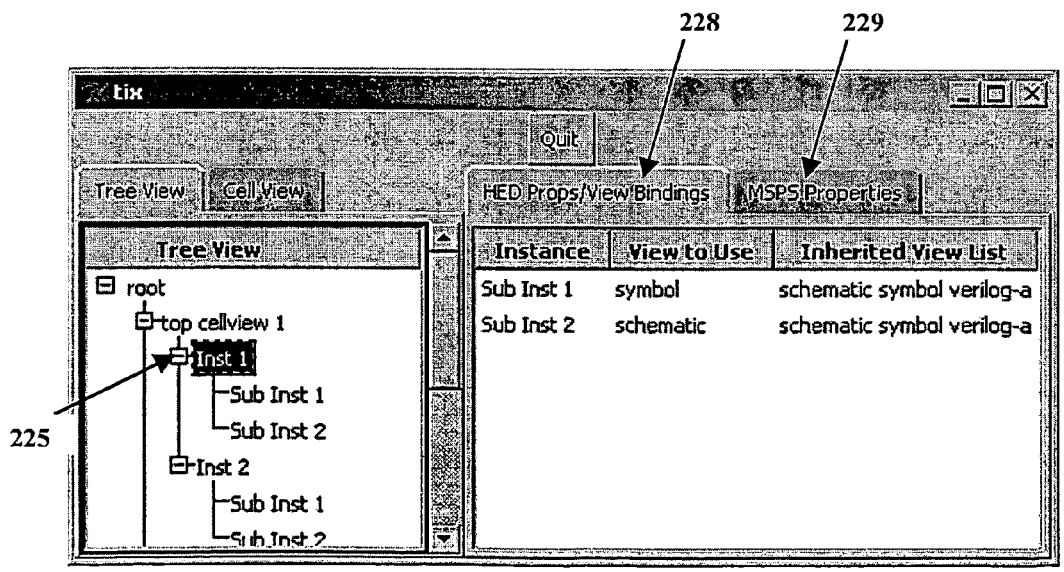
FIG. 2B is a representation of an example Visualization Tool display.

In some embodiments, each block table, component table and node of a tree display are associated with a row of data entry/display fields. The entry fields allow the user to enter property values/rules at varying hierarchical levels of the design. Example entry fields are shown by elements 206 and 208 in FIG. 2A. An additional field indicates the resolved property value for the block, component, or node. Some embodiments uses multiple columns to display the multiple properties for a given block. Properties can also be arranged in groups. This group ordering, and the visualization of same in the user interface visualization tool, makes the user interface more intuitive, and makes a single property easier to find among a large number of properties. For example, elements 228 and 229 in FIG. 2B show property groups. This is analogous to how a filing system makes it easier to organize large numbers of documents.

Figure 2C:
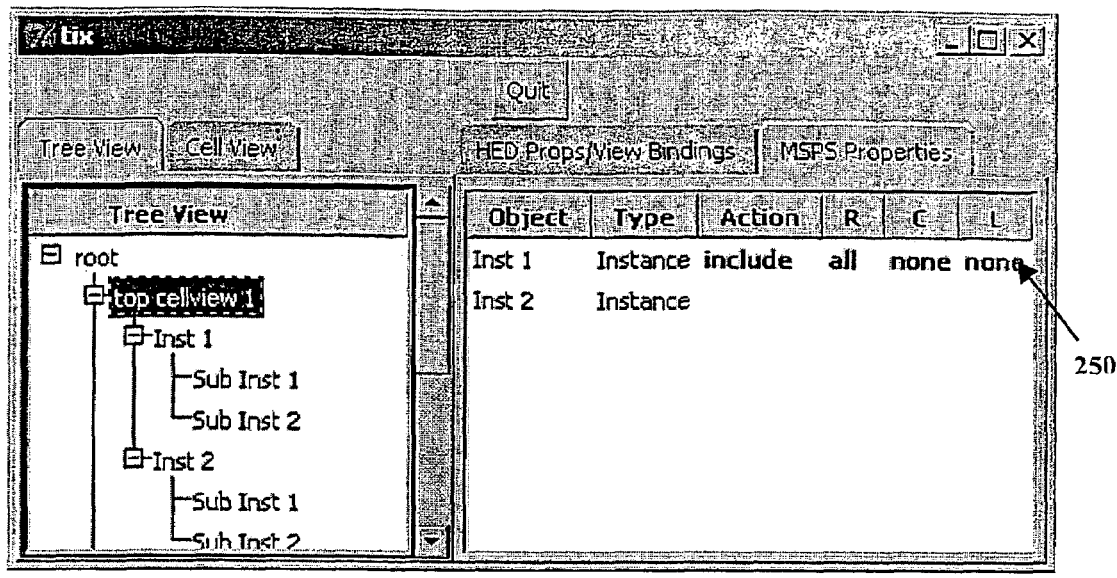
FIG. 2C is a representation of an example Visualization Tool display.

In another embodiment the rules can be specified in differing levels of granularity for example: globally, per-cell, per-instance-within-a-cell and per-unique occurrence. Example element 250 in FIG. 2C shows the value of the properties of component "Inst 1." Element 250 is an example of a per-cell property value. In another embodiment, the Visualization Tool 102 contains a fixed precedent ordering that resolves rules by precedence. In this embodiment, rules specified on a per-occurrence basis override those on a per-instance-within-a-cell basis, which in turn override those specified on a per-cell basis, which in turn override those specified on a global basis.

Figure 2D:
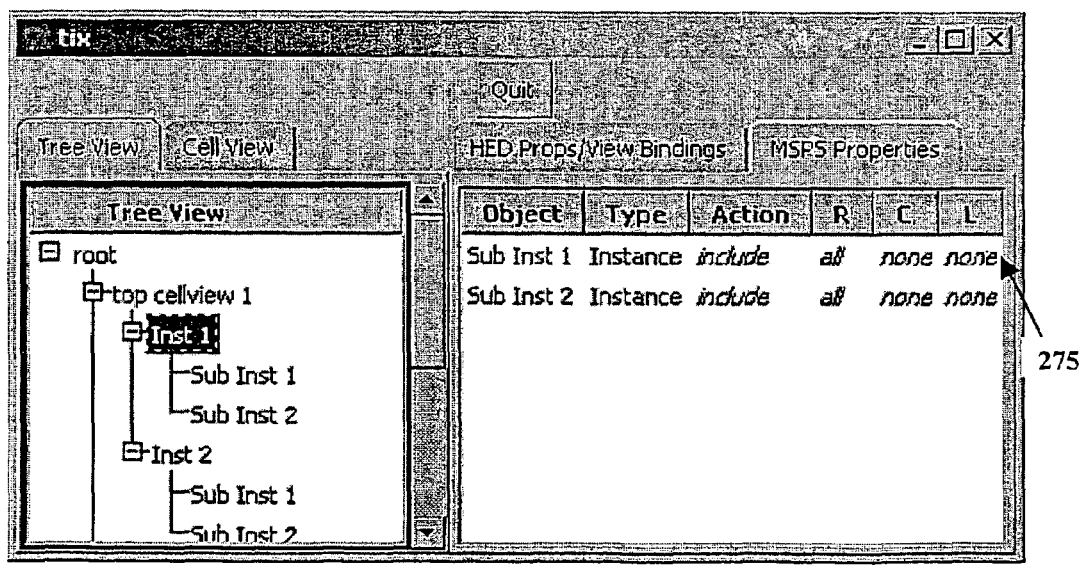
FIG. 2D is a representation of an example Visualization Tool display.

In this embodiment, properties are inherited downwards in the design hierarchy, such that a property value specified on any given block is automatically inherited by all sub-hierarchies below that block, unless over-ridden with another rule explicitly placed on a component further down in the sub-hierarchy below that block. Example element 275 in FIG. 2D shows that sub-blocks "Sub Inst 1" and "Sub Inst 2" in block Inst1 inherit the Inst 1 property values. In another embodiment, inherited values are identified by visual display, such as in a different font and/or a different color, in italics, bold, or in italics of a specific color.

In some embodiments, Visualization Tool 102 contains a Property Manager 106A shown in FIG. 1A. Property Manager 106A allows entry of rules/properties of any blocks in the design in the context of the hierarchy and resolves all the rules to calculate one effective value for each property on a per component basis. It is programmable to handle any and all properties/rules for a circuit design. That is, Property Manager 106A can be programmed as to the individual and the sets of properties for a particular application, and can be programmed as to the resolution rules (i.e., hierarchical inheritance and precedence) of applying those properties. Using the programmed information, the Property Manager 106A resolves the effective value of each property for each block, sub-block and component in the design. The Visualization Tool 102 displays the resulting effective property values for each block/component in each of the block table, component table, and tree display so the user can view the effective property values in the context of the hierarchy.

In some embodiments, the Property Manger 106A allows feedback to be provided on a query basis which details the mechanics of arriving at any particular property resolution for any component in the design, and explains any errors of conflict. In another embodiment, the errors of conflict can also be graphically indicated. In one embodiment, the user requests the feedback in the form of a select button. In response to the request, Property Manager 106A and Visualization Tool 102 display: the effective values of the properties for that block, the rules factoring into the calculation, and an explanation of the mechanics behind the rules resolution calculation. The user can edit property values and request explanations until the desired property values are obtained.

Property Dictionary 108 shown in FIG. 1A is a file that houses the definition of all the properties available to the circuit design. This general programming information can include property name, data type, valid range, default value, use restrictions, dependency rules, and description. In another embodiment the Property Dictionary 108 can link properties together in a group by defining, property groups, property subgroups, and group members. This grouping mechanism provides for intuitive ordering and property look up in the Visualization Tool 102. In one embodiment, The Property Dictionary 108 is created in a specific syntax. One example syntax is listed in Appendix A.

In another embodiment, Visualization Tool 102 outputs a property configuration file, as shown in element 112A in FIG. 1A. The Visualization Tool 102, reads the Property Dictionary 108 to obtain the definitions of the properties, reads the design file 110A to determine the hierarchical design, and reads the specific properties the user assigned to the components in the hierarchical design in Property Manger 106 to create the property configuration file. The property configuration file is created so that the general properties and their resolution rules can be stored in a persistent manner on a disk. This allows the property settings to be entered once only, and as the circuit design itself is changed repeatedly while debugging a problem, the user need only point at the previously stored property settings without having to re-enter them from scratch. In one embodiment, the property configuration file has a specific syntax. The syntax provides for multiple properties or groups of properties and their resolution rules to be listed in a format that the Property Manager can read. The property configuration file includes at least the following information for each property: name, type, valid values, a list of the levels of hierarchy for which the property may be specified, and the rules for inheritance and precedence for each of the supported levels of hierarchy. An example syntax for the property configuration file is shown in Appendix B.

FIG. 3A details the property configuration process 310. In process action (312) the circuit design and Property Dictionary are input into the Visualization Tool. The Visualization Tool traverses the circuit design and presents the user with the hierarchical circuit design display. The user enters the property setting for a set of components of the design in the Visualization Tool hierarchical display in process action (313). The Visualization Tool rationalizes the property definitions from the Property Definition file, the property value settings input by the user and the hierarchical precedence rules to calculate the resolved property values for all components in the design. The user views the resolved property values in the hierarchy in process action (314). In process action (315) the user decides whether to retain the property value setting or to modify the settings. If the property values are to be changed, process 310 returns to process action (313) to edit the property settings. If the property values are acceptable and do not need to be changed, process action (316) outputs the property configuration file and stores it on a disk.

Figure 1B:
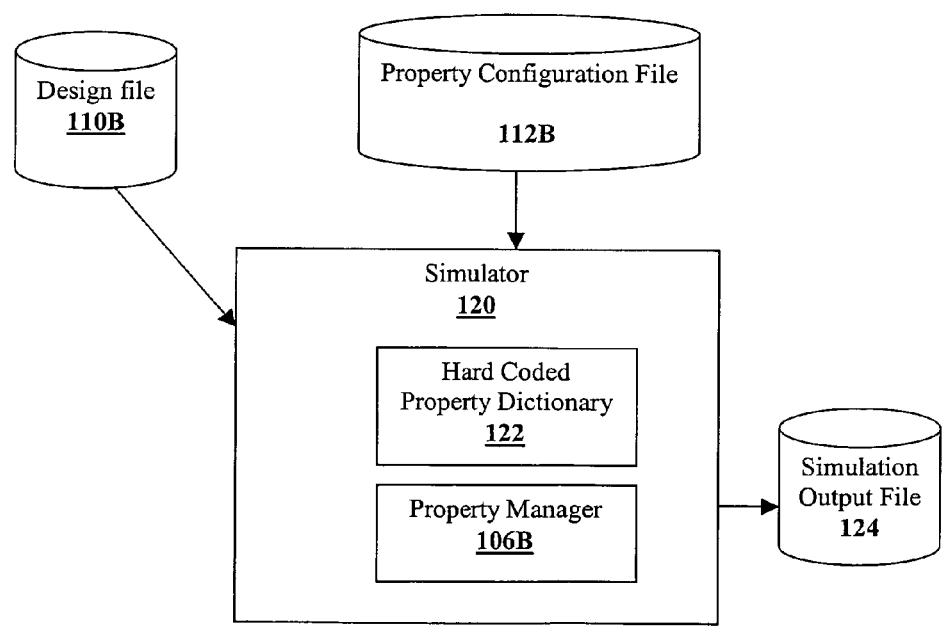
FIG. 1B is a representation of an example application of the hierarchical, rules-based, general property visualization and editing tool system.

In some embodiments, the Property Manger and property configuration file are linked into other applications, (such as circuit Simulator 120 in FIG. 1B). This linkage is provided such that the other applications resolve the rules consistently with those graphically illustrated by the Visualization Tool 102. This discussion will also refer to process 300 in FIG. 3B. In process action (302) the user defines the properties in the Visualization Tool 102. The property configuration file 112B is created in process action (304). The definition information in this case is hard coded into the application as Hard Coded Property Dictionary 122, shown in FIG. 1B. An embodiment allows a designer to specify and debug/develop a set of circuit simulation rule-based properties within the context of a hierarchical design. The circuit design is simulated in process action (306) by simulator 120 using Hard Coded Property Dictionary 122 and Property Manager 106B. The designer can view the Simulation Output file 124 to determine if the results meet the design criteria and if not, edit the design or properties of components.

Figure 3C:
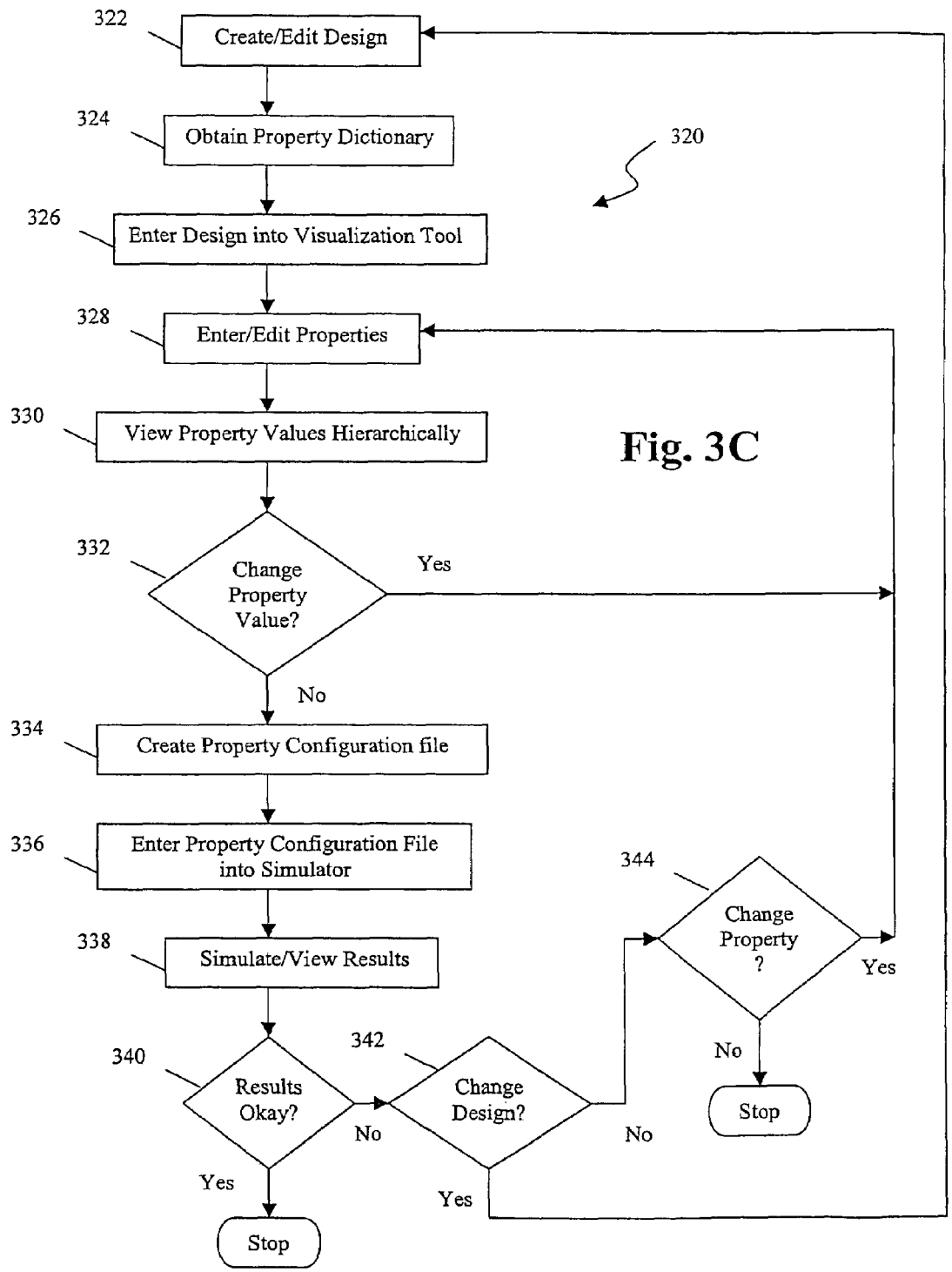
FIG. 3C is a representation of detailed circuit design, property configuration, and simulation process 320.

Process 320 in FIG. 3C details the entire circuit design creation and simulation process using the Visualization Tool. The circuit design is created in process action (322). In process action (324) the Property Dictionary is obtained. In some cases the Property Dictionary can be supplied by a vendor, in other cases an expert user can create it. The circuit design file is input into the Visualization Tool in process action (326). The Visualization Tool traverses the circuit design and presents the circuit design in a hierarchical display capable of property entry. In process action (328) the user enters properties for a set of components/blocks in the circuit design in the Visualization Tool. The Visualization Tool rationalizes the property definitions from the Property Definition file, the property settings from the user entry, and the hierarchical precedence rules to calculate the effective property values for all the (remaining) components. In process action (330) the user views the effective property value for any component in the design. At process action (332) the user decides if the effective property values need to be changed or if it is acceptable. If the value is to be changed, process 320 returns to process action (328) to edit the properties. These steps are repeated for various components/blocks in the circuit design. If the effective property values are acceptable, process 320 continues to process action (334) where the Property Configuration file is created and stored. In process action (336), the property configuration file is input into a simulator. A simulator is just one example application that can be used with the embodiments disclosed herein. The simulator uses the same Property Manger and Property Dictionary as the Visualization Tool to ensure the same effective property value results are obtained. In process action (338), the user views the simulation results. In process action (340) the user decides if the simulation results are acceptable. If the results are acceptable, the circuit design is complete and process 320 stops. If the simulation results are not acceptable, the user decides in process action (342) whether to change the design. If the user wants to modify the design, process 320 returns to process action (322) to start the circuit design process over again. If the user does not want to modify the design, process action (344) allows the user to decide to modify the property settings. If the user decides to modify the property setting, process 320 returns to process action (328) to edit property settings. If the user does not want to modify the properties, then process 320 stops.

ALTERNATIVE EMBODIMENTS AND APPLICATIONS

There are many other applications of the embodiments in the field of automated circuit design, as practically every modern design creation, analysis and verification tool has to deal with traversing hierarchical designs and applying various types of property rules in the context of those designs. The paragraphs below detail some example applications but is not meant to be an exhaustive list.

One embodiment is Device Safe Operating Area Checks in which a designer verifying a circuit is interested in determining via simulation if various devices/components within the design are operating within their "safe" limits. The designer can specify various property rules governing what types of checks he wants performed at different levels of the design hierarchy using property groups of the Visualization Tool.

Another embodiment can be used for Table Based Modeling in which a designer who is simulating/exploring a circuit topology can take advantage of the speed of table-based device models for a particular part of the design hierarchy, and can use more physically accurate models for a different part of the design hierarchy, when using a circuit simulation tool such as Spice. A rule based system such as the Visualization Tool allows the designer to indicate which areas/sub-hierarchies of the designs are to be associated with table models, and which by the more accurate physical models, and/or various levels of models that fall in between those two levels of abstraction.

Another example application is Block Simulation Accuracy in which an "expert user" designing, exploring, or verifying a circuit topology via simulation, can specify simulation accuracy/speed tradeoff parameters on a per design block or sub-hierarchy basis (such as for example the RELTOL parameter used in Spice simulators).

Another example application is Partitioning in which a designer can partition his circuit into various partitions, for various reasons. For example, a designer can simulate a given partition of his design using a digital simulation engine, and the remaining portion of his design using an analog simulation engine, when performing a mixed-signal simulation. Further, such a user can easily change the partitioning, depending on the effects he is trying to observe. Another example of partitioning may be where a user can "implement" a given portion of his digital circuit in high-speed/high-power technology, with another in a lower-speed but lower-power technology, i.e. specify the voltage/power domains of a multiple-supply, multiple-voltage system on chip. Such specifications can be carried across multiple tools in the design analysis and verification flows, and applied in various ways by those tools in a consistent manner via the Property Manager and Property Dictionary. A more specific example is where interface elements inserted between the digital and analog domains in a mixed signal simulation, automatically adjust the voltage thresholds which effect analog-to-digital and digital-to-analog signal conversion, depending on the voltage domain specification rules specified by the designer for the various blocks in the design.

Another example is Partition/Multi-Rate:Advanced Simulation in which the Visualization Tool is used to split the design into several partitions within a simulator, effectively simulating each partition somewhat independently of the others (also known as multi-rate-simulation), thus optimizing their treatment of each partition locally. While automatic partitioning via built-in algorithms is possible for this purpose, it is often the case that the designer "knows better" than these algorithms, and wishes to override or influence via properties the partitioning of the design for this particular purpose.

Another example is EP (Intellectual Property) Protection in which a user can specify various levels of encryption/ protection/visibility and have them applied to the various blocks/sub-hierarchies in the design.

Another example is Parasitic Re-Simulation in which a designer can have several views of given design blocks available, for example one view representing pre-layout design information, and another representing post-layout design information, with the latter view containing large quantities of parasitic elements included for the corresponding given block. In order to effectively simulate such representations of the various design blocks, a designer can specify properties to filter the parasitic elements in various ways, to reduce the size of the simulation problem. The designer can also check that he hasn't over-filtered, and thus removed the source of the problem that he was originally trying to inspect.

System Architecture Overview

Figure 4:
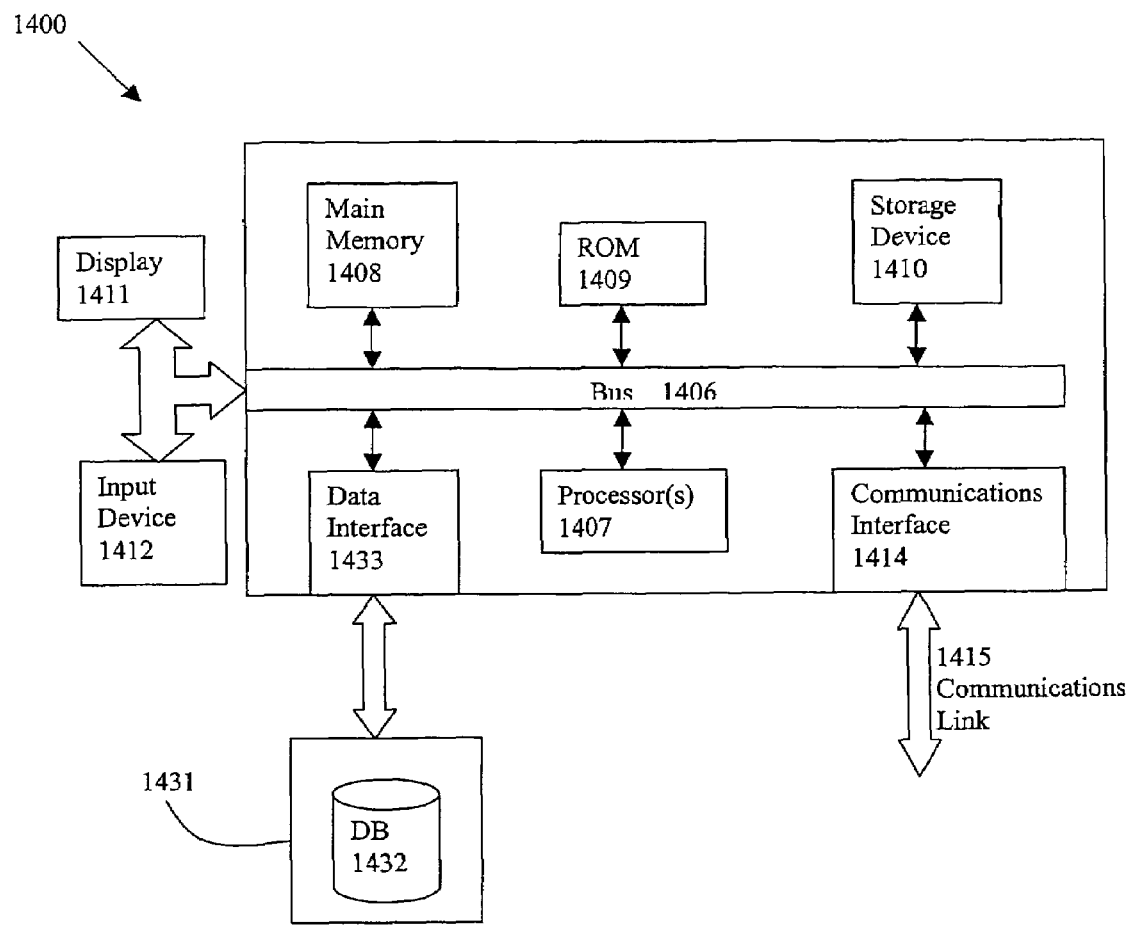
FIG. 4 is a representation of a system 1400 that would contain provide hierarchical, rules-based, general property visualization and editing.

The execution of the sequences of instructions required to practice the embodiments may be performed by a computer system 1400 as shown in FIG. 4. In an embodiment, execution of the sequences of instructions is performed by a single computer system 1400. According to other embodiments, two or more computer systems 1400 coupled by a communication link 1415 may perform the sequence of instructions in coordination with one another. Although a description of only one computer system 1400 will be presented below, however, it should be understood that any number of computer systems 1400 may be employed to practice the embodiments.

A computer system 1400 according to an embodiment will now be described with reference to FIG. 4, which is a block diagram of the functional components of a computer system 1400. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem, or the communication link 1415 may be the Internet, in which case the communication interface 1414 may be a dial-up, cable or wireless modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

In the foregoing specification, the embodiments have been described with reference to specific elements thereof. It will, however, be evident that various modifications and changes may be made thereto without departing from the broader spirit and scope of the embodiments. For example, the reader is to understand that the specific ordering and combination of process actions shown in the process flow diagrams described herein is merely illustrative, and that using different or additional process actions, or a different combination or ordering of process actions can be used to enact the embodiments. The specification and drawings are, accordingly, to be regarded in an illustrative rather than restrictive sense.

APPENDIX A

Property Dictionary Sample Database Syntax

```
file-format-id 01.01; // optional, should be on first line
/* this is a comment in style 1 */
// this is a comment in style 2 (to end of line)
//----------------------
// Property definitions:
//----------------------
occPropDef someProp
{
   valueType = int;
   valueRange = "0 <= value <= 6";
   valueDefault = 6;
   useRestrictions =   cantBeOnOcc cantBeOnInst cantBeOnCell \
                       cantBeGlobal cantInherit;
   description = "This is a description string. \
It can be multi-line if the previous line ends in backslash. \
blah, blah";
}
occPropDef mos_vres
{
   valueType = double;
   valueDefault = "0.50";
   valueRange = "0.0 <= value < 4.3";
   description = "Voltage increment for mosfet table model \ interpolation grid";
   dependency = "showOnlyIf mos_method == accelerated";
}
occPropDef mos_method
{
   valueType = enum;
   valueRange = "standard accelerated";
   valueDefault = "standard";
   description = "Table models . . . Berkeley SPICE . . . blah, blah";
   toolTip =
"General Description of prop ; description of enum #1 ; \
description of enum #2";
   // Forms with colon (":") instead of an equals sign ("=") are
   // non-exclusive. i.e. you can have as many as you like.
   affectedApp: "AMSUltra";
   affectedApp: "AMSSpectre";
}
occPropDef speed
{
   valueType = enum;
   valueRange = "Off 1 2 3 4 5 6";
   valueDefault = "Off";
   . . .
}
occPropDef errpreset
```

APPENDIX A-continued

Property Dictionary Sample Database Syntax

```
{
  valueType = enum;
  valueRange = "moderate conservative liberal";
  valueDefault = moderate;
  dependency = "defaultSetTo conservative When speed == 0 \
Or speed == 1";
  ...
}
// The following is the method for adding an affected app to an      //
existing occPropDef. The assumption is that there will be one owner  //
within Cadence for a particular property and the only thing that
// another Cadence group will need to do is add another affected app.
occPropDef mos_method addAffectedApp "Hspice";
// -------
// Groups:
// -------
propGroup <groupName>
{
  memberProp: <propName>;
  memberProp: <propName2>;
}
// Groups can have sub-groups
propGroup topGroup/subGroup/subsubGroup
{
  // note that description and toolTip (below) are group rather than
  // property definition (occPropDef) attributes.
  description = "this is a sub group of topGroup/subGroup";
  toolTip = "tip";
  memberProp:    <propName>;
  memberProp:    <propName2>;
  memberProp:    TYPE_IN_FIELD affectedApp <appName1>;
  memberProp:    TYPE_IN_FIELD affectedApp <appName2>;
                 // The above might cause the UI to present
                 // something like:
                 //    app1 or app2 prop: <blank> = <blank>
                 // to the user.
}
// If definitions for topGroup and topGroup/subGroup don't exist, they
// are implied by the previous. (The implied groups only contain
// their respective subgroup.)
// Add to an existing group. Don't complain about overrides
+propGroup <groupName>
{
  // In a +occPropGroup, assignments will override any existing
  // definition of group attributes. (Only description and toolTip
  // are supported on groups.)
  description = "this is a group";
  memberProp: <propName>;
}
// Remove a member property from a group
propGroup <groupName> removeMemberProp <propName>;
include <path>;   // If relative, it relative to including file.
                  // Note that ${ENV_VAR} and
                  //   $(inst_root_with:icfb)
                  // style reference will be supported in <path>
```

APPENDIX B

Sample property file (prop.cfg) syntax

```
file-format-id 01.01; // optional, should be on first line
/* this is a comment in style 1 */
// this is a comment in style 2 (to end of line)
config syslib.video:myconfig; /* optional path to expand.cfg */
default // aka global
{
  string prop
  {
    foo = "bar";
    bar = "1 atmosphere";
  }
  int prop foo = 7;
}
default string prop foo = "hi there";
```

APPENDIX B-continued

Sample property file (prop.cfg) syntax

```
cell someCell string prop sourcefile = "$MY_LOC/spice/someCell";
cell lib1.cell1 string prop sourcefile = "${MY_LOC}/cell1";
cell top no-eval string prop tclCmd = "doIt $tclVal $tclVal2";
inst (lib.cell:view) .instName
{
  string prop partition = "ultrasim";
  int prop foo = 6;
}
inst i1 string prop myprop = "my prop value";
cell top non-inherited string prop sim_mode = "df";
path (syslib.video:rtl) . (moto.mpeg1)i12.i7
{
  string prop sim_mode = "a";
  int prop
  {
    acc = 2;
    turbo = 42;
  }
}
path (top) .i2.i3 string prop sim_mode = "a";
path (top) .i2.i3.i4 string prop path = /usr/local/bin/per15;
path (top) .i1.i3.*.*   // here *.* means anything two levels down
                        // from (top) .i1.i3
{
  double prop acc = 2.718281828;  // formatted as C scanf
                                  // can read
}
path i3 int prop foo = 42; /* full path is (top) .i1.i3 */
```

We claim:

1. A method of specifying property values of a hierarchical circuit design, comprising:
   configuring a set of supported properties based on an analysis tool, wherein configuring includes:
   selecting one or more of the set of supported properties for one or more of the components of the design; and
   setting effective values for a first set of selected properties for the one or more of the components of the design; and
   calculating effective values for a second set of selected properties for the one or more of the components of the design, wherein calculating values is based on the property setting of any related components or blocks; and
   viewing the set and calculated effective values, the selecting, setting, calculating and viewing accomplished using an interface tool, the interface tool showing the components and properties for at least one level of the hierarchy of the circuit design.

2. The method of claim 1, further comprising:
   outputting a configuration file from the interface tool that stores at least one effective value for at least one property setting for one or more of the components of the design; and
   analyzing the circuit design with the analysis tool based on the configuration file.

3. The method of claim 2, wherein the configuration file, per property, comprises:
   name, data type, valid values, a list of the levels of the hierarchy for which the property may be specified, and the rules for inheritance and precedence for each of the supported levels.

4. The method of claim 2, further comprising:
   determining if the analysis results are acceptable;
   determining if the property settings should be edited, if the analysis results are unacceptable;

repeating the setting, outputting, and analyzing if the property settings should be edited;

determining if the circuit design should be edited, if the analysis results are unacceptable; and modifying the circuit design and repeating the setting, outputting, and analyzing if the circuit design should be edited.

5. The method of claim 1, wherein the calculated effective values are displayed in a distinct visual manner, the visual manner comprising one or more of font size, font typeface, font family, color, thickness, and spacing.

6. The method of claim 5, wherein the calculated effective values include an inherited property value, the inherited property value being a property value that assumes the setting of another property value higher in the hierarchy.

7. The method of claim 6, wherein the inherited property value is displayed in a distinct visual manner.

8. The method of claim 1, wherein calculating effective values is further based on the property setting of the component.

9. The method of claim 8, wherein the calculated effective values are displayed in a distinct visual manner.

10. The method of claim 1, wherein the properties are each assigned to one or more groups, and are viewable based on group.

11. The method of claim 2, wherein outputting a configuration file comprises:
    determining if the calculated effective value for the component is acceptable;
    repeating the viewing and determining until the component property settings are acceptable for each component in the circuit design; and
    storing the property values for the circuit design in a property configuration file.

12. The method of claim 11, wherein storing comprises: storing in persistent storage to render the re-entry of property settings unnecessary.

13. The method of claim 1, wherein configuring the set of supported properties can be accomplished by an application vendor or a user.

14. The method of claim 1, wherein the analysis tool can be any electronic design analysis application.

15. The method of claim 1, wherein configuring the set of supported properties further includes setting the following information per property:
    property name, data type, valid range, default value, use restrictions, dependency rules and descriptions, property groups, property subgroups, and group members.

16. The method of claim 1, wherein viewing the property value comprises:
    requesting an explanation of the calculated property value for the component; and
    viewing the explanation.

17. The method of claim 16, wherein the explanation comprises:
    component property settings which affects the calculated property value, and
    intermediate calculations of the calculated property value.

18. The method of claim 17, wherein intermediate calculations comprises conflicts, conflicts being calculations that adversely affect the resultant property value.

19. The method of claim 1, wherein the analysis tool is one or more of a simulator, a safe area checking application which allows testing of compliance of component operation in safety limits, a table-based modeling application which allows table based modeling on a portion of the circuit design, an application for controlling block simulation accuracy which allows specification of simulation accuracy and speed parameters of components, a partitioning application which allows portioning of the circuit design, an intellectual property (IP) protection application which allows specification of IP protection level, and a parasitic re-simulation application which allows a plurality of methods to filter out parasitic elements.

20. A system of specifying property values of a hierarchical circuit design, comprising:
    means for configuring a set of supported properties based on an analysis tool which includes:
        means for selecting one or more of the set of supported properties for one or more of the components of the design; and
        means for setting effective values for a first set of properties for the one or more of the components of the design for at least one level of the hierarchy of the circuit design;
    means for calculating effective values for a second set of properties for the one or more of the components of the design, wherein calculating values is based on the property setting of any related components or blocks; and
    means for viewing the set and calculated effective values for at least one level of the hierarchy of the circuit design.

21. The system of claim 20, further comprising:
    means for outputting a configuration file that stores at least one effective value for at least one property setting for one or more of the components of the design; and
    means for analyzing the circuit design based on the configuration file.

22. A computer program product embodied on computer readable medium, the computer readable medium having stored thereon a sequence of instructions which, when executed by a processor, causes the processor to execute a method for specifying property values of a hierarchical circuit design, the method comprising:
    configuring a set of supported properties based on an analysis tool wherein configuring includes:
        selecting one or more of the set of supported properties for one or more of the components of the design; and
        setting effective values for a first set of selected properties for the one or more of the components of the design;
    calculating effective values for a second set of selected properties for the one or more of the components of the design, wherein calculating values is based on the property setting of any related components or blocks; and
    viewing the set and calculated effective values, the selecting, setting, calculating and viewing accomplished using an interface tool, the interface tool showing the components and properties in hierarchical fashion consistent with the hierarchy of the circuit design.

23. The computer program product of claim 22, further comprising:
    outputting a configuration file from the interface tool that stores at least one effective value for at least one property setting for one or more of the components of the design; and
    analyzing the circuit design with the analysis tool based on the configuration file.

24. A method of analyzing a hierarchical circuit design, comprising:
    configuring a set of supported properties based on an analysis tool, wherein configuring includes:

setting effective values for the properties for one or more of the components of the design using an interface tool, the interface tool showing the properties for at least one level of the hierarchy of the circuit design; and calculating effective values for the properties for the one or more of the components of the design, wherein calculating values is based on the property setting of any related components or blocks;

outputting a configuration file from the interface tool that stores at least one effective value for at least one property setting for one or more of the components of the design; and analyzing the circuit design based on the configuration file.

25. The method of claim 24, wherein configuring the properties further comprises:

selecting one or more of the set of supported properties for one or more components of the design;

setting effective values for a first set of selected properties; and calculating effective values for a second set of selected properties.

26. The method of claim 25, wherein calculating effective values is based on the property setting of any related components.

27. The method of claim 26, wherein the calculated effective value is displayed in a distinct visual manner, the visual manner comprising one or more of font size, font typeface, font family, color, thickness, and spacing.

28. The method of claim 27, wherein the calculated effective values includes an inherited property value, the inherited property value being a property value that assumes the setting of another property value higher in the hierarchy.

29. The method of claim 28, wherein the inherited property value is displayed in a distinct visual manner.

30. The method of claim 25, wherein calculating the effective value is based on the property setting of the component and the property setting of any related components or blocks.

31. The method of claim 30, wherein the calculated effective value is displayed in a distinct visual manner.

32. The method of claim 25, wherein the property are each assigned to one or more groups, and are viewable based on group.

33. The method of claim 24, wherein outputting the configuration file comprises:

determining if the calculated effective value for the component is acceptable;

repeating the viewing and determining until the component property settings are acceptable for each component in the circuit design; and storing the property values for the circuit design in a property configuration file.

34. The method of claim 33, wherein storing comprises: storing in persistent storage to render the re-entry of property settings unnecessary.

35. The method of claim 24, wherein configuring the set of supported properties is accomplished by an application vendor or a user.

36. The method of claim 24, wherein the analysis tool can be any electronic design analysis application.

37. The method of claim 24, wherein configuring the supported properties includes setting the following information per property:

property name, data type, valid range, default value, use restrictions, dependency rules and descriptions, property groups, property subgroups, and group members.

38. The method of claim 25, wherein viewing the property value comprises:

requesting an explanation of the calculated the value for the component; and viewing the explanation.

39. The method of claim 38, wherein the explanation further comprising:

each component property setting which affects the resultant property value, and intermediate calculations of the resultant property value.

40. The method of claim 39, wherein the intermediate calculations comprising conflicts, conflicts being calculations that adversely affect the resultant property value.

41. The method of claim 24, wherein the configuration file, per property, comprises:

name, data type, valid values, a list of the levels of hierarchy for which the property may be specified, and the rules for inheritance and precedence for each of the supported levels.

42. The method of claim 24, further comprising:

determining if the analysis results are acceptable;

determining if the property settings should be edited, if the analysis results are unacceptable;

repeating the setting, outputting, and analyzing if the property settings should be edited;

determining if the circuit design should be edited, if the analysis results are unacceptable; and modifying the circuit design and repeating the setting, outputting, and analyzing if the circuit design should be edited.

43. The method of claim 24, wherein the analysis tool is one or more of a simulator, a safe area checking application which allows testing of compliance of component operation in safety limits, a table-based modeling application which allows table based modeling on a portion of the circuit design, an application for controlling block simulation accuracy which allows specification of simulation accuracy and speed parameters of components, a partitioning application which allows portioning of the circuit design, an intellectual property (IP) protection application which allows specification of IP protection level, and a parasitic re-simulation application which allows a plurality of methods to filter out parasitic elements.

* * * * *